(12) United States Patent
Chuang et al.

(10) Patent No.: US 8,213,257 B2
(45) Date of Patent: Jul. 3, 2012

(54) VARIATION-TOLERANT WORD-LINE UNDER-DRIVE SCHEME FOR RANDOM ACCESS MEMORY

(75) Inventors: Ching-Te Chuang, Hsinchu (TW); Yi-Wei Lin, Hsinchu (TW); Chia-Cheng Chen, Hsinchu (TW); Wei-Chiang Shih, Hsinchu (TW)

(73) Assignees: Faraday Technology Corp., Science-Based Industrial Park, Hsin-Chu (TW); National Chiao Tung University, Hsinchu (TW)

( * ) Notice: Subject to any disclaimer, the term of this patent is extended or adjusted under 35 U.S.C. 154(b) by 186 days.

(21) Appl. No.: 12/852,759

(22) Filed: Aug. 9, 2010

(65) Prior Publication Data

US 2012/0033522 A1 Feb. 9, 2012

(51) Int. Cl.
*G11C 8/00* (2006.01)

(52) U.S. Cl. ............... 365/230.06; 365/241; 365/189.05

(58) Field of Classification Search ............. 365/230.06, 365/214, 189.05
See application file for complete search history.

(56) References Cited

U.S. PATENT DOCUMENTS

| 4,858,181 | A | * | 8/1989 | Scharrer et al. | ............... 365/155 |
| 5,020,028 | A | * | 5/1991 | Wanlass | ........................ 365/154 |
| 6,462,998 | B1 | * | 10/2002 | Proebsting | .................... 365/205 |

* cited by examiner

*Primary Examiner* — Tuan T. Nguyen
(74) *Attorney, Agent, or Firm* — Winston Hsu; Scott Margo

(57) ABSTRACT

A Random Access Memory (RAM) is provided. The RAM includes a plurality of word-line drivers, at least a first tracking transistor and a second tracking transistor. Each word-line driver has an input node receiving a decoding signal, a power node receiving an operation voltage and a driving node driving a word-line. In an embodiment, the first tracking transistor has two channel terminal nodes respectively coupled to the driving node of one of the word-line driver and a channel terminal node of the second tracking transistor; wherein the first tracking transistor has electronic characteristics tracking those of a driving transistor of word-line driver, and the second tracking transistor has electronic characteristics tracking those of pass-gate transistor(s) in each cell of the RAM.

12 Claims, 10 Drawing Sheets

VARIATION-TOLERANT WORD-LINE UNDER-DRIVE SCHEME FOR RANDOM ACCESS MEMORY

BACKGROUND

1. Technical Field

The present invention relates to Random Access Memory (RAM), and more particularly, to RAM with variation-tolerant word-line under-drive scheme for stability enhancement of low-voltage operation by introducing at least a first and a second tracking transistors respectively tracking electronic characteristics of driving transistors of word-line drivers and pass-gate transistors of RAM cells.

2. Description of the Related Art

Random Access Memory (RAM), such as Static Random Access Memory (SRAM) has become one of the most important building blocks of modern electronic circuits, chips and/or systems.

BRIEF SUMMARY

Advanced semiconductor manufacturing process, such as sub-100 nm process, introduces promising potential toward low-voltage operation, low power-consumption and scaled-down layout area for RAM. However, such advanced process suffers from variations of process, supply voltage and temperature. The variations can lead to degradation of RAM stability. For example, the Read disturb in SRAM reduces the Read Static Noise Margin (RSNM) and degrades the stability during Read operation.

A RAM includes a memory cell array of a plurality of rows; each of the rows includes a plurality of cells coupled to a corresponding Word-Line (WL). The voltage of each word-line is controlled by a corresponding word-line driver. Each cell has a latch (e.g., a pair of cross-coupled inverters) with two storing nodes and at least a pass-gate transistor with a control node (a gate) and two channel terminal nodes (e.g., a drain and a source) respectively coupled to the corresponding word-line, one of the storing nodes, and a corresponding Bit-Line (BL).

While reading a given cell of a given row and a given bit-line, the given bit-line is pre-charged to a high voltage representing logic "High"; through the given word-line, the pass-gate transistor of the given cell is enabled by the corresponding word-line driver to connect a corresponding storing node to the given bit-line. If the storing node stores a low voltage representing logic "Low", the latch discharges the given bit-line from original high voltage to a low voltage representing logic "Low". However, the pass-gate transistor and the pull-down transistor of the cell inverter form a voltage divider, and the voltage at the logic "Low" storing node is raised, causing "Read disturb" in the cell storage node. If the pass-gate transistor has low turn-on resistance (relative to the cell pull-down transistor) between its two channel terminal nodes, the Read disturb voltage at the storing node can be raised above the "Trip Voltage" (a voltage threshold causing switching of the inverter) of the opposite cell inverter, and the bit stored in the latch will be erroneously flipped, i.e., the storing node originally stores logic "Low" state of the low voltage would be incorrectly flipped to store logic "High" state of the high voltage.

The aforementioned issue is commonly called a Read disturb; and variations of process, supply voltage and temperature aggravate Read disturb, since the conduction behavior of pass-gate transistors (e.g., the word-line voltage used to enable pass-gate transistors, turn-on resistance of pass-gate transistors) and cell inverter switching point (Trip Voltage) tend to spread with wider variation ranges such that the Read disturb voltages at the cell storing nodes introduced by the pass-gate transistors are more likely to exceed the Trip Voltages of the opposite cell inverters.

One solution to reduce Read disturb is by properly lowering the word-line enable voltage provided by the word-line drivers for enabling (turning on) the pass-gate transistors. Lowered word-line enable voltage implements a Word Line Under-Drive (WLUD) scheme to reduce the channel conductivity of the pass-gate transistors, thus increasing turn-on resistance between the two channel terminal nodes of each pass-gate transistor and reducing the Read disturb from pre-charged bit-lines to storing nodes. While implementing such WLUD scheme with the word line drivers, it is preferred to dynamically adjust the word-line voltage level by tracking aforementioned variations for achieving better variation-tolerance.

Therefore, an object of the present invention is to provide a RAM implementing a variation-tolerant Word-Line Under-Drive (WLUD) scheme providing lowered word-line enable voltage which can be dynamically adjusted following/tracking variations of transistor characteristics caused by process, voltage, and temperature. The RAM of the invention includes a plurality of rows, a plurality of word-line drivers, at least a first tracking transistor and at least a second tracking transistor. Each of the rows has a plurality of cells and a corresponding word-line; each cell includes a latch for storing data, and at least a pass-gate transistor coupled between the latch, the corresponding word-line and a corresponding bit-line. Each of the word-line drivers has a power node receiving an operation voltage, a driving node coupled to one of the word-lines of the rows, an input node receiving a decoding signal and a driving transistor comprising a control node and two channel terminal nodes respectively coupled to the input node, the driving node and the power node.

The first tracking transistor, corresponding to one of the word-line driver and having two channel terminal nodes, has electronic characteristics tracking those of the driving (pull-up) transistor of the corresponding word-line driver. One of the two channel terminal nodes of the first tracking transistor is coupled to the word-line, and the other channel terminal node is coupled to one of the two channel terminal nodes of the second tracking transistors. The second tracking transistor, including a channel terminal node coupled to one of the two channel terminal nodes of the first tracking transistor, has electronic characteristics tracking those of the pass-gate transistors of the cells.

According to one aspect of the invention, the word-line under-drive scheme is implemented by a plurality of first tracking transistors and a plurality of second tracking transistors. Each of the first tracking transistors corresponds to one of the word-line drivers and has a control node and two channel terminal nodes (e.g., a gate, a drain, and a source). Each of the second tracking transistors corresponds to one of the first tracking transistors, and also has a control node and two channel terminal nodes (e.g., a gate, a drain, and a source). In an embodiment, the control node and the two channel terminal nodes of each first tracking transistor are respectively coupled to a second voltage source (e.g., a ground voltage source), the corresponding word-line, and one of the channel terminal nodes of the corresponding second tracking transistor, with the other channel terminal node and the control node of the corresponding second tracking transistor respectively coupled to the second voltage source (e.g., a ground voltage source) and the corresponding word-line. The power nodes of the word line drivers commonly couple a first voltage source (e.g., a power voltage source) to one of the channel terminal nodes (i.e. source) of the word-line driving (pull-up) transistors.

Following aforementioned embodiment, the control node of each of the first tracking transistor can be coupled to the input node of the corresponding word-line driver instead of the second voltage source.

In another embodiment of the invention, several word-line drivers can be grouped to share a shared second tracking transistor, each of the grouped word-line drivers corresponds to one of the first tracking transistors with the control node and two channel terminal nodes of the corresponding first tracking transistor respectively coupled to the input node of the corresponding word-line driver, the corresponding word-line, and one of the channel terminal nodes of the shared second tracking transistor. The control node of the shared second tracking can be coupled to the first voltage source or a voltage controller.

As another aspect of the invention, the two channel terminal nodes of a first tracking transistor, referred to as a power-side first tracking transistor, are respectively coupled to the first voltage source and the power nodes of the word-line drivers. The channel terminal nodes of a second tracking transistor, referred to as a power-side second tracking transistor, are respectively coupled to the power nodes of the world-line drivers and the second voltage source. Word-line under-drive scheme is then implemented by reducing the operation voltage supplied to the word-line drivers.

The aforementioned implementation can combine with circuit architecture where the first tracking transistors are coupled to the word-line. Besides the power-side first and second tracking transistors coupled to the power nodes of the word-line drivers, additional first and second tracking transistors, respectively referred to as driving-side first and second tracking transistors, are included. The control node and the two channel terminal nodes of each driving-side first tracking transistor are respectively coupled to the second voltage source, the corresponding word-line, and one of the channel terminal nodes of a corresponding driving-side second tracking transistor, with the other channel terminal node and the control node of the corresponding driving-side second tracking transistor respectively coupled to the second voltage source and the corresponding word-line. Alternatively, the control nodes of each driving-side first tracking transistor and its corresponding driving-side second tracking transistor can be respectively coupled to the input node of the corresponding word-line driver and a shared voltage controller. Or, the driving-side first tracking transistors can be grouped to share a shared driving-side second tracking transistor with the two channel terminal nodes of each driving-side first tracking transistor respectively coupled to the corresponding word-line and one of the channel terminal nodes of the shared driving-side second tracking transistor.

According to still another aspect of the invention, each word-line driver corresponds to a first tracking transistor and a second tracking transistor, the control node and the two channel terminal nodes of each first tracking transistor are respectively coupled to the second voltage source, the corresponding word-line, and the second voltage source; the control node and the two channel terminal nodes of each second tracking transistor are respectively coupled to the corresponding word-line driver, the second voltage source, and the corresponding word-line. Alternatively, each word-line driver can correspond to one first tracking transistor and two second tracking transistors respectively referred to as a shunt second tracking transistor and a serial second tracking transistor, with the channel terminal nodes of the first tracking transistor respectively coupled to the word-line and a channel terminal node of the serial second tracking transistors, and the channel terminal nodes of the shunt second tracking transistor respectively coupled to the word-line and a channel terminal node of the serial second tracking transistor. Or, several word-line drivers can be grouped to share a shared second tracking transistor with each word-line driver also corresponding to a first tracking transistor and a shunt second tracking transistor besides the shared second tracking transistor. For each word-line driver, the channel terminal nodes of the corresponding first tracking transistor are respectively coupled to the word-line and a channel terminal node of the shared second tracking transistor, and the channel terminal nodes of the corresponding shunt second tracking transistor are respectively coupled to the word-line and a channel terminal node of the shared second tracking transistor.

Other objectives, features and advantages of the present invention will be further understood from the further technological features disclosed by the embodiments of the present invention wherein the described preferred embodiments of this invention are shown, by illustration of modes best suited to carry out the invention.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
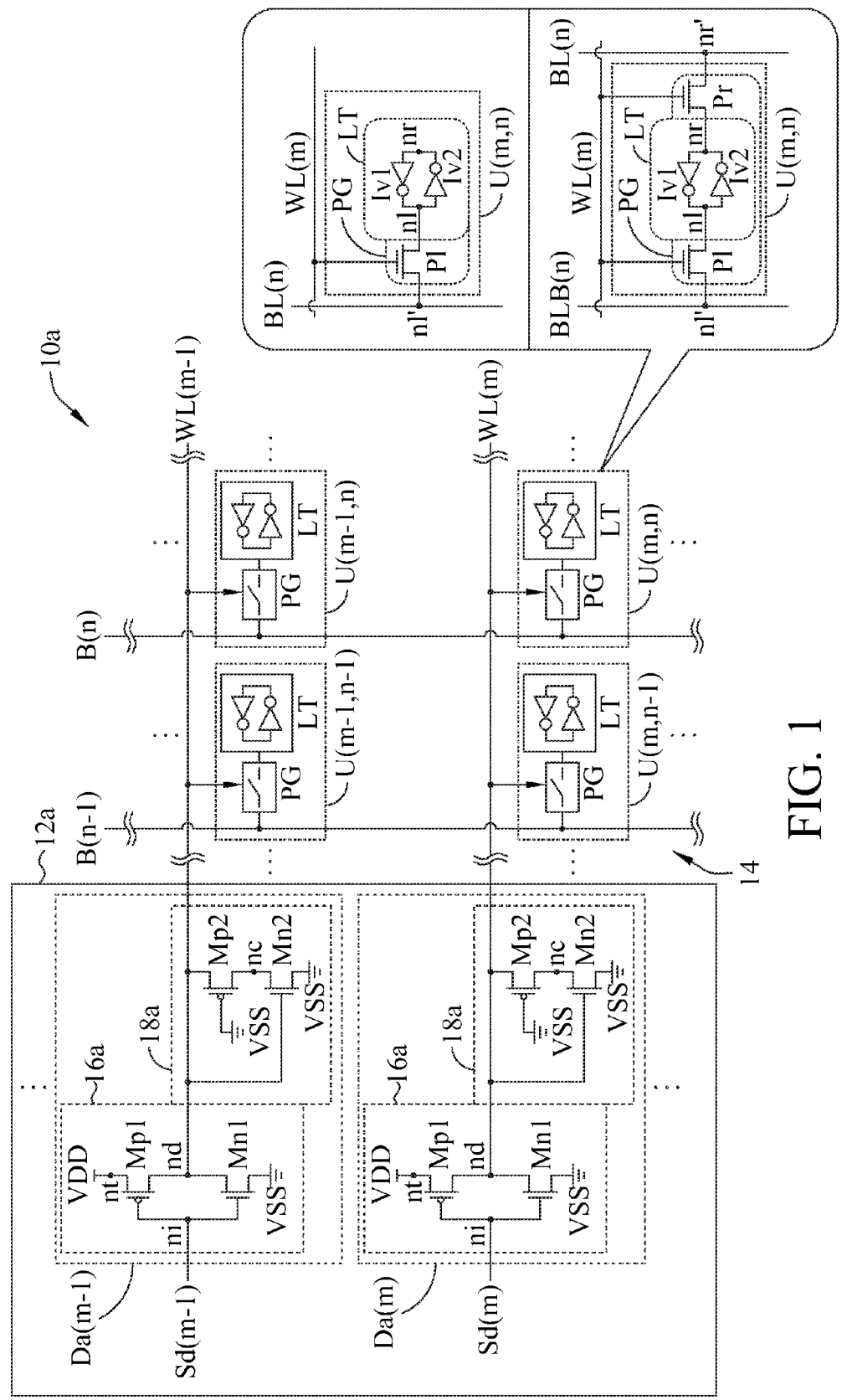
FIGS. 1-10 illustrate SRAMs according to different embodiments of the invention.

Please refer to FIG. 1, which illustrates a RAM 10a according to an embodiment of the invention. The RAM 10a includes a memory cell array 14 and a word-line driving circuit 12a. The memory cell array 14 has a plurality of rows, each of the rows includes a plurality of cells and a corresponding word-line; for example, cells U(m−1,n−1) and U(m−1,n) belong to the same row corresponding to a word-line WL(m−1); cells U(m,n−1) and U(m,n) belong to the same row corresponding to the word-line WL(m). Each cell, generally represented by the cell U(m,n), has a latch LT for storing data (e.g., a binary bit) and an access switch PG controlling access of a bit-line bus B(n) according to the voltage of the word-line WL(m). The bit-line bus B(n) couples the cells U(m−1,n) and U(m,n) of the same column, and the bit-line bus B(n−1) couples the cells U(m−1,n−1) and U(m,n−1) of another column.

FIG. 1 also demonstrates two embodiments of the memory cell U(m,n); the latch LT can be formed by two inverters Iv1 and Iv2 cross-coupled between two nodes (two storing nodes) nr and nl. In one cell embodiment, the bit-line bus B(n) includes a single bit-line BL(n), therefore the access switch PG has a transistor Pl as a single pass-gate transistor (e.g., an n-channel MOS transistor) with a control node (a gate) and two channel terminal nodes (a drain and a source) respectively coupled to the corresponding word-line WL(m), the storing node nl, and a node nl' of the bit-line BL(n). In another cell embodiment, the bit-line bus B(n) has two complemented bit-lines BL(n) and BLB(n), so the access switch PG includes two transistors Pl and Pr as pass-gate transistors. The two channel terminal nodes of the transistor Pl are coupled between the node nl and a node nl' of the bit-line BLB(n), the two channel terminal nodes of the transistor Pr are coupled between the node nr and a node nr' of the bit-line BL(n). Both control nodes of the transistors Pl and Pr are coupled to the word-line WL(m).

The word-line driving circuit 12a of the invention implements word-line under-drive scheme for either of the cell embodiments. The word-line driving circuit 12a, operating between two voltage sources VDD (a power voltage source) and VSS (a ground voltage source), includes a plurality of driving units, each driving unit provides a word-line voltage for a corresponding word-line; for example, the word-line driving units Da(m) and Da(m−1) respectively correspond to the word-lines WL(m) and WL(m−1).

Each word-line driving unit, generally represented by the word-line driving unit Da(m), includes a word-line driver 16a and a voltage adjuster 18a. The word-line driver 16a has a transistor Mp1 (e.g., a p-channel MOS transistor) and a transistor Mn1 (e.g., an n-channel MOS transistor); nodes ni, nd, and nt respectively are an input node receiving a corresponding decoding signal Sd(m) (from, e.g., a word address predecoder, not shown), a driving node coupled to the word-line WL(m), and a power node receiving an operation voltage from the voltage source VDD.

The transistor Mp1 is a pull-up driving transistor, it has a control node and two channel terminal nodes respectively coupled to the node ni, nt, and nd; and the transistor Mn1 is a pull-down driving transistor with a control node and two channel terminal nodes respectively coupled to the node ni, the voltage source VSS, and the node nd. The word-line driver 16a controls the voltage transition of the word-line WL(m); when a cell corresponding to the word-line WL(m) is to be accessed, the decoding signal Sd(m) triggers the word-line driver 16a of the word-line driving unit Da(m) to raise the voltage of the word-line WL(m); the pull-up driving transistor Mp1 turns on to pull up the word-line voltage toward the voltage source VDD to provide a word-line enable voltage, so the pass-gate transistor(s) of the cells coupled to the word-line WL(m) (e.g., cells U(m,n−1) and U(m,n)) are enabled to conduct.

To implement the variation-tolerant word-line under-drive scheme of the invention, the voltage adjuster 18a works with the word-line driver 16a in each word-line driving unit Da(m) to lower the word-line enable voltage enabling the pass-gate transistors of the word-line WL(m) and to maintain the word-line enable voltage against variations. In the embodiment of FIG. 1, the voltage adjuster 18a includes a transistor Mp2 (e.g., a p-channel MOS transistor) as a first tracking transistor and a transistor Mn2 (e.g., an n-channel MOS transistor) as a second tracking transistor. In each word-line driving unit Da(m), the transistor Mp2, with a control node and two channel terminal nodes respectively coupled to the voltage source VSS, the node nd, and a node nc, has electronic characteristics (e.g., turn-on resistance between channel terminal nodes, driving ability and/or threshold voltage) tracking those of the driving transistor Mp1 of the corresponding word-line driver 16a. The transistor Mn2, with a control node and two channel terminal nodes respectively coupled to the node nd, the node nc, and the voltage source VSS, has electronic characteristics tracking those of the pass-gate transistors in the access switch PG of each cell coupled to the word-line WL(m).

The voltage adjuster 18a works as follows. In the word-line driving unit Da(m), when the transistor Mp1 of the word-line driver 16a turns on to pull up the voltage of the word-line WL(m) to provide a word-line enable voltage for enabling the pass-gate transistors coupled to it, the transistor Mn2 of the voltage adjuster 18a also turns on, so the transistors Mp2 and Mn2 both turn on to drain a current from the node nd, then the voltage of node nd (i.e., the word-line enable voltage of the word-line WL(m)) is lowered to a value less than the voltage source VDD to implement a word-line under-drive scheme. Equivalently, turned on transistors Mp2 and Mn2 provide a resistance shunt between the node nd and the voltage source VSS to lower the word-line enable voltage.

In addition, the word-line enable voltage provided by the word-line driving unit Da(m) will be dynamically and automatically adjusted by the tracking transistors Mp2 and Mn2 to maintain the word-line enable voltage against variations. For example, when the pull-up transistor Mp1 drives the word-line enable voltage, if process variations cause the driving transistor Mp1 to be a fast transistor with higher current driving capability and less channel resistance (turn-on resistance between two channel terminal nodes), the transistor Mp1 tends to raise the voltage of the node nd higher to provide a word-line enable voltage closer to the voltage source VDD. However, since the driving capability of the transistor Mp2 tracks that of the transistor Mp1, the transistor Mp2 also has a lower turn-on channel resistance, and the voltage adjuster 18a drains more current from the node nd; therefore the word-line enable voltage at the node nd can be dynamically maintained with reduced dependency on the variations.

Similarly, if the pass-gate transistors coupled to the word-line WL(m) become fast due to variations, they tend to raise the Read disturb voltages of the storing nodes, thus increasing the possibility of unexpected data flips. However, as the transistor Mn2 tracks the behavior and performance of the pass-gate transistors, the transistor Mn2 also becomes fast and has a lower turn-on channel resistance, and the voltage adjuster 18a drains more current from the node nd to lower the word-line enable voltage of the word-line WL(m), so the channel conductivity of the pass-gate transistors (hence the Read disturb voltage) will be reduced.

The use of tracking transistor Mn2, instead of a passive resistor, in the voltage adjuster 18a of the word-line driving unit Da(m) also helps to improve the voltage rise-time of the word-line WL(m) to achieve better access timing. When the word-line driver 16a starts to pull up the voltage of the node nd from a low voltage (e.g., close to the voltage source VSS), initially low voltage of the node nd keeps the transistor Mn2 from fully turning on, so in the beginning transistors Mp2 and Mn2 of the voltage adjuster 18a do not drain current against charging of the node nd by the word-line driver 16a, thus allowing the voltage of the node nd to build up faster (comparing with, for example, an embodiment wherein the transistor Mn2 is replaced by a passive resistor which will drain current against charging of the node nd right from the beginning of the word-line voltage pull-up transition). Also, since the power node nt of the word-line driving unit Da(m) is directly coupled to the voltage source VDD, the transistor Mp1 is supplied with full high voltage of the voltage source VDD to speed up the rising transition of the word-line enable voltage.

Figure 2:
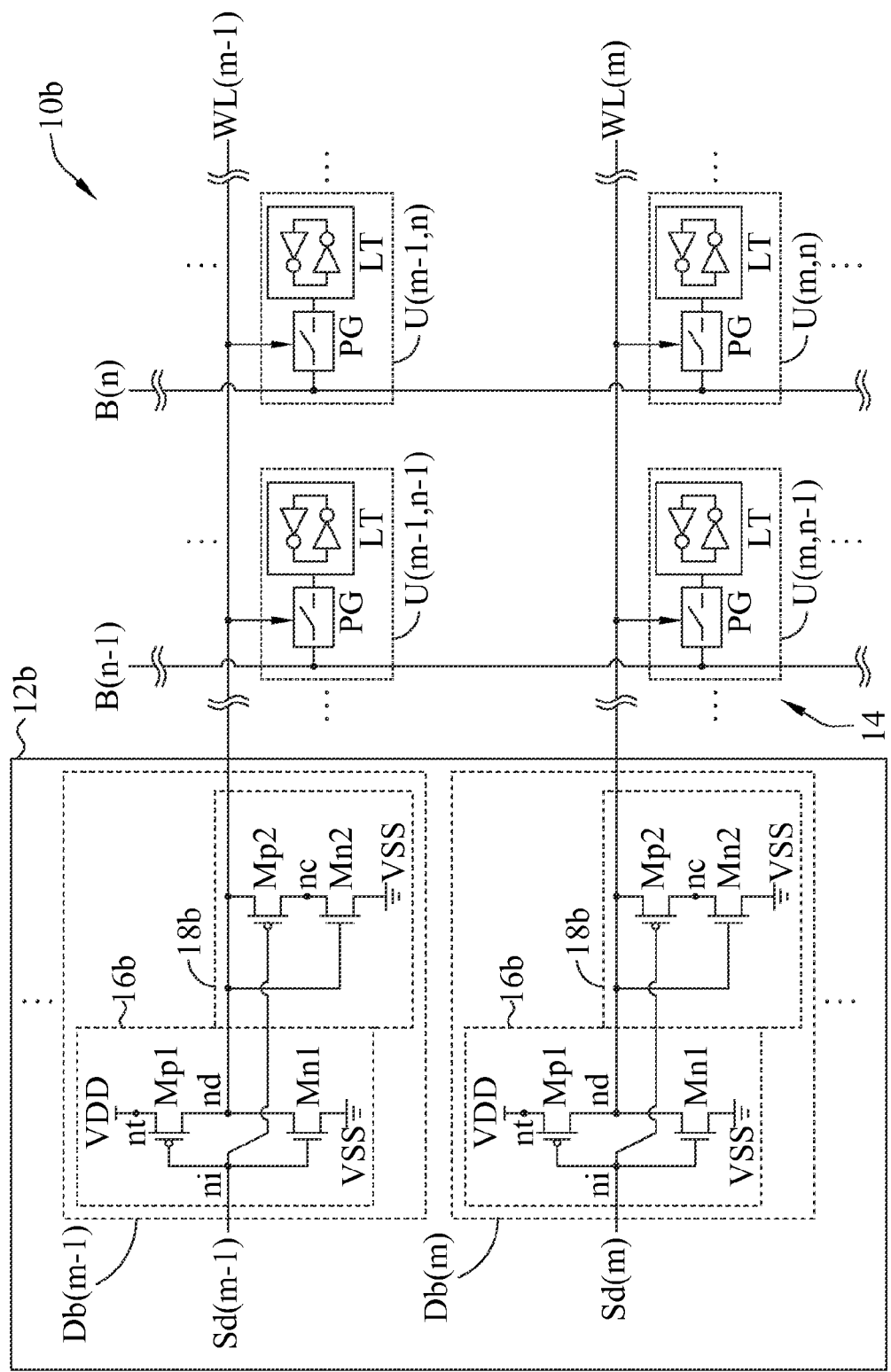

The RAM 10a of FIG. 1 can be modified to a RAM 10b of FIG. 2 according to another embodiment of the invention. Similar to the word-line driving circuit 12a of RAM 10a, the word-line driving circuit 12b of RAM 10b has word-line driving units such as Db(m−1) and Db(m), each word-line driving unit Db(m) has a word-line driver 16b with driving transistors Mp1 and Mn1, and a voltage adjuster 18b with tracking transistors Mp2 and Mn2. In each word-line driving unit Db(m), the control node of the tracking transistor Mp2 is coupled to the node ni instead of the voltage source VSS. It is understood that the voltage adjuster 18b needs to work only when the decoding signal Sd(m) at the node ni becomes a low voltage to trigger a voltage pull-up transition at the node nd when the word-line WL(m) is selected, so the control node of the transistor Mp2 can be controlled by the decoding signal Sd(m). When the decoding signal Sd(m) goes low to turn on the pull-up driving transistor Mp1 of the word-line driver 16b, the transistor Mp2 is also turned on, and the voltage adjuster 18b is ready to maintain and compensate word-line enable voltage of the word-line WL(m). When the decoding signal rises to high voltage to disable access of the word-line WL(m), both transistor Mp1 and Mp2 will be turned off. In RAM 10b, the layout area of the word-line driving circuit 12b can be reduced; since transistor Mp1 and Mp2 are both coupled to nodes ni and nd, they can be arranged with better/less layout area.

Figure 3:
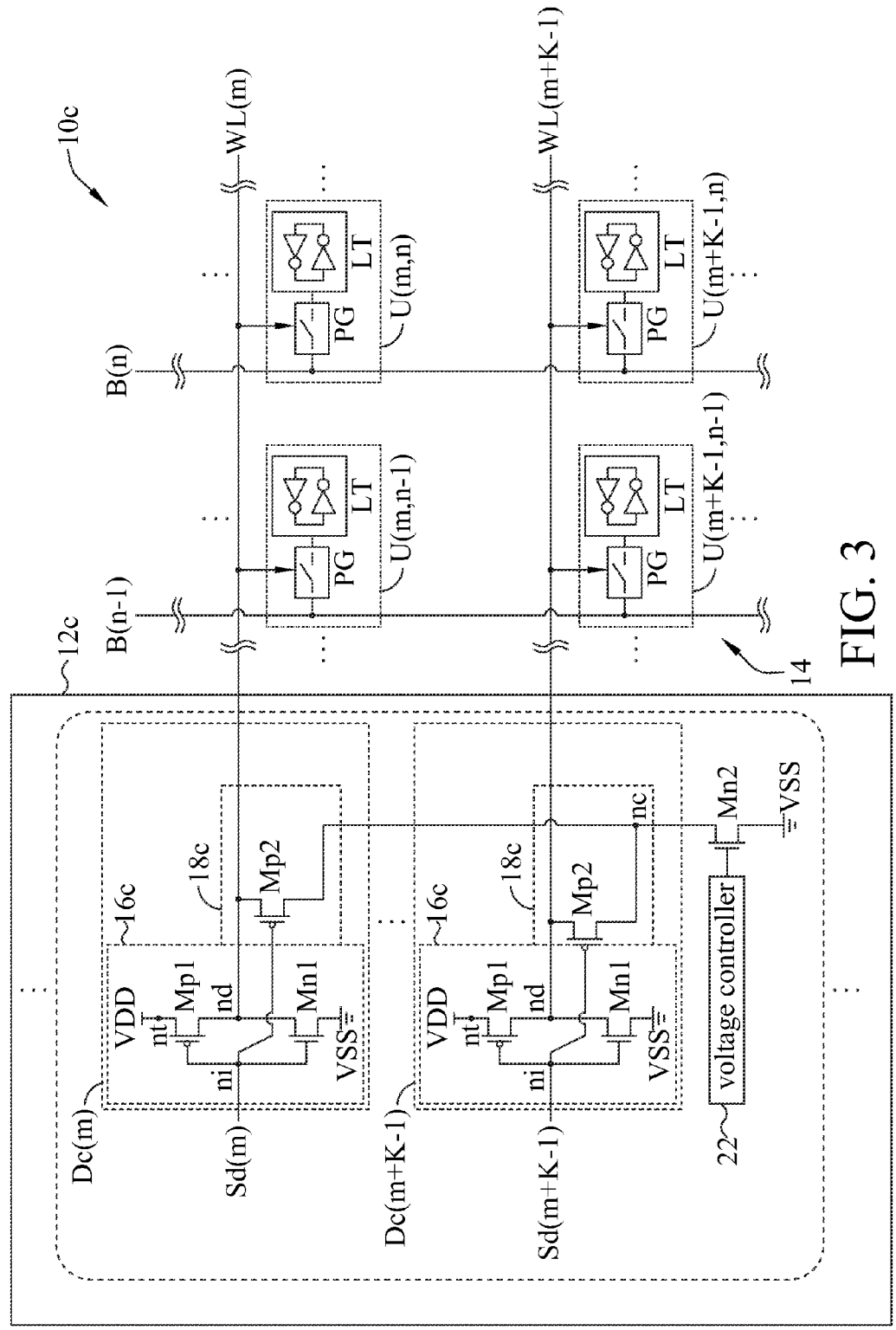

Following FIG. 1 and FIG. 2, please refer to FIG. 3 demonstrating a RAM 10c according to another embodiment of the invention. A word-line driving circuit 12c of RAM 10c has word-line driving units such as Dc(m) to Dc(m+K−1) respectively driving word-lines WL(m) to WL(m+K−1). Each word-line driving unit, generally represented by the word-line driving unit Dc(m), has a word-line driver 16c with driving transistors Mp1 and Mn1, and a voltage adjuster 18c with a first tracking transistors Mp2. While each word-line driving unit Da(m) in FIG. 1 or Db(m) in FIG. 2 has a corresponding second tracking transistor Mn2, several word-line driving units, such as K word-line driving units Dc(m) to Dc(m+K−1), can be grouped to share a shared second tracking transistor Mn2, as shown in FIG. 3. The two channel terminal nodes of each first tracking transistor Mp2 in each of the word-line driving units Dc(m) to Dc(m+K−1) are respectively coupled to the node nd (i.e. the corresponding word-line) of the corresponding word-line driver 16c and the channel terminal node of the shared second tracking transistor Mn2. The control node (i.e. the gate) of the shared second tracking transistor Mn2 is coupled to a voltage controller 22 to receive a gate bias voltage. In addition to advantages similar to those of the RAM 12a and RAM 12b, layout area of the RAM 12c can be reduced since a single second tracking transistor Mn2 is shared by many word-line driving units.

Grouping of the word-lines WL(m) to WL(m+K−1) (and corresponding word-line driving units Dc(m) to Dc(m+K−1)) can be so arranged such that there is only one word-line enabled at a time while the rest are kept disabled. Thus, only a first tracking transistor Mp2 is turned on to work with the shared second tracking transistor Mn2 at a time. Since the shared second tracking transistor Mn2 does not have to face many turned on transistors Mp2 at the same time, the shared second tracking transistor Mn2 does not need a large layout area. In the RAM 10c, all word-line driving units of all rows in an active sub-array can share a single second tracking transistor Mn2; that is, K can equal the number of rows in the active memory sub-array 14. Alternatively, all rows of the active memory sub-array 14 can be grouped into different groups; for example, word-lines WL(m) to WL(m+K−1) are grouped into a first group to share a second tracking transistor Mn2, and word-lines WL(m+K) to WL(m+2*K−1) are grouped into a second group to share another second tracking transistor Mn2, etc. Each shared second tracking transistor Mn2 can have its own voltage controller 22; or, the shared second tracking transistors Mn2 of different groups can commonly share a single voltage controller 22.

The voltage controller 22 can be a programmable voltage source to provide a programmable gate bias voltage for the second tracking transistor Mn2. As the RAM 12c is implemented in a die or a chip, the voltage controller 22 can be used to adjust the word-line under-drive level to compensate for variations among different dice/chips. For example, for a RAM 12c in a first die suffering variations of fast p-channel transistors leading to higher word-line enable voltage, the voltage controller in the first die can be programmed to provide a higher gate bias voltage to lower the word-line enable voltage; for a RAM 12c in a second die suffering variations of slow p-channel transistors leading to lower word-line enable voltage, the voltage controller in the second die can be programmed to provide a lower gate bias voltage to increase the word-line enable voltage. Programming of the voltage controller 22 can be achieved by an internal programmer, such as a built-in self-tester, inside the die/chip. Alternatively, a test before shipping of dice/chips can be performed to decide a suitable programming for each die/chip and the programming is them burned into a non-volatile memory of each die/chip. Or, the die/chip can have input pin(s) receiving external programming.

Figure 4:
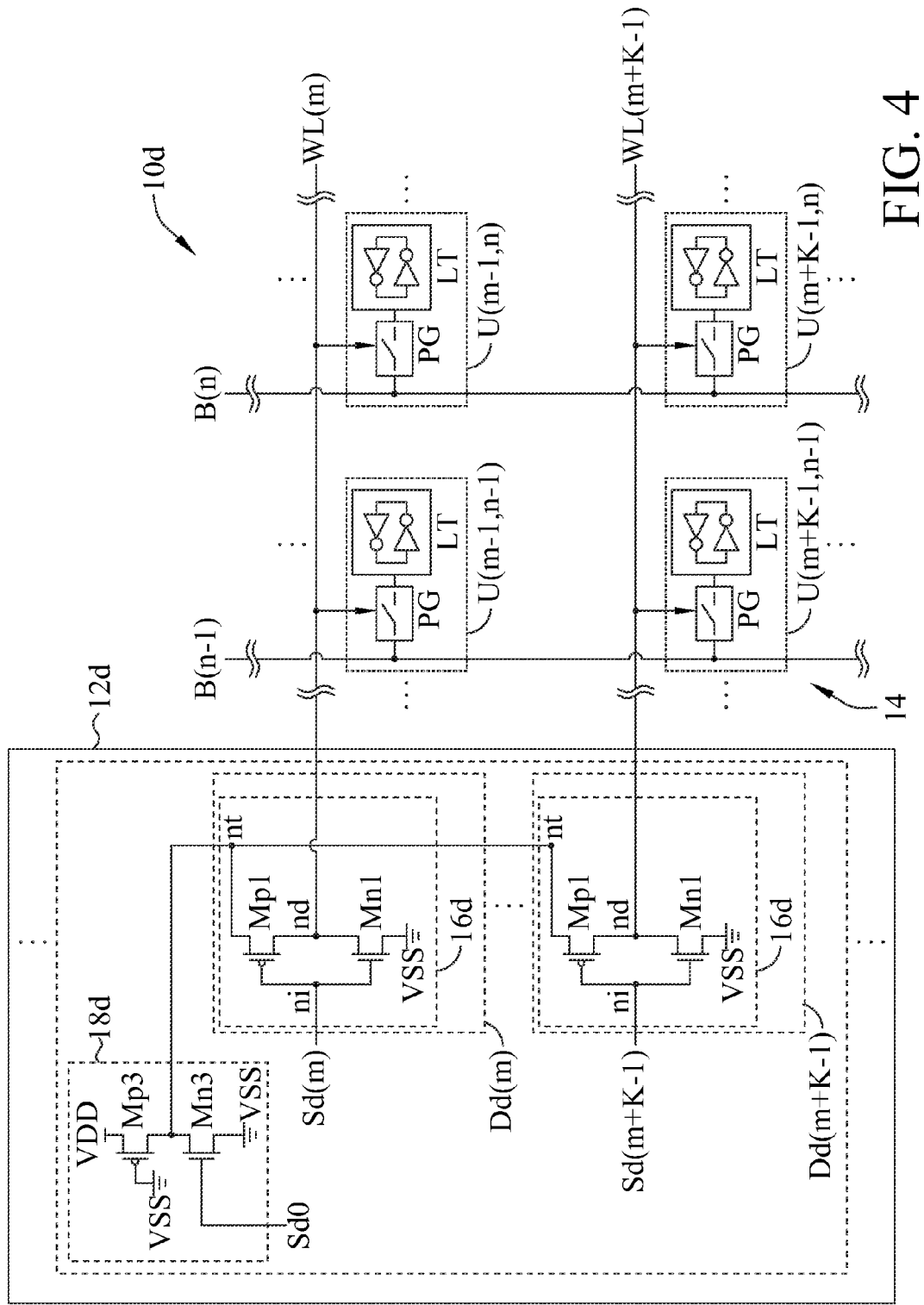

Please refer to FIG. 4 depicting a RAM 10d according to another embodiment of the invention. The RAM 10d has a word-line driving circuit 12d with a plurality of word-line driving units driving word-lines of the memory cell array 14, such as word-line driving units Dd(m) to Dd(m+K−1) respectively corresponding to word-lines WL(m) to WL(m+K−1). Each word-line driving unit, generally represented by the word-line driving unit Dd(m), has a word-line driver 16d including transistors Mp1 and Mn1 as a pull-up driving transistor and a pull-down driving transistor, respectively. The word-line driver 16d of the word-line driving unit Dd(m) has a node ni as an input node receiving a decoding signal Sd(m), a node nt as a power node receiving supplied operation voltage, and a node nd providing word-line enable voltage for the corresponding word-line WL(m).

The word-line driving units Dd(m) to Dd(m+K−1) are grouped to share a voltage adjuster 18d including a pair of transistors Mp3 (e.g., a p-channel MOS transistor) and Mn3 (e.g., an n-channel MOS transistor) respectively referred to as a power-side first tracking transistor and a power-side second tracking transistor. A control node and two channel terminal nodes of the power-side first tracking transistor Mp3 are respectively coupled to the voltage source VSS, the voltage source VDD, and the nodes nt of the word-line driving units Dd(m) to Dd(m+K−1); a control node and two channel terminal nodes of the power-side second tracking transistor Mn3 are respectively coupled to a decoding signal Sd0, the voltage source VSS, and the nodes nt of the word-line driving units Dd(m) to Dd(m+K−1). As the transistors Mp3 and Mn3 control the voltage at the node nt of each of the grouped word-line driving units Dd(m) to Dd(m+K−1), word-line under-drive scheme is then implemented by reducing the operation voltage supplied to the word-line drivers 16d of the word-line driving units Dd(m) to Dd(m+K−1).

The word-lines WL(m) to WL(m+K−1) corresponding to the word-line driving units Dd(m) to Dd(m+K−1) can be so grouped such that the decoding signal Sd0 turns on the power-side second tracking transistor Mn3 while accessing one of the word-lines WL(m) to WL(m+K−1). Therefore, the channel resistances of the power-side tracking transistors Mp3 and Mn3 perform voltage dividing between the voltage sources VDD and VSS to supply an operation voltage lower than the voltage source VDD, and the word-line enable voltage provided by the word-line drivers 16d of the word-line driving units Dd(m) to Dd(m+K−1) is therefore lowered. To maintain a stable word-line enable voltage against variations, electronic characteristics of the power-side first tracking transistor Mp3 tracks those of the transistors Mp1, and electronic characteristics of the power-side second tracking transistor Mn3 tracks those of the cell pass-gate transistors. For example, when the word-line WL(m) is to be enabled, a fast transistor Mp1 tends to draw more current to lower the voltage at the node nt; and a fast transistor Mp3, with a lower turned-on channel resistance, tends to raise the voltage at the node nt, so the supplied operation voltage at the node nt, as well as the word-line enable voltage at the node nd, can be maintained with reduced dependency on variations.

In the RAM 10d, all word-line driving units of all rows can share a same pair of power-side tracking transistors Mp3 and Mn3; that is, K equals number of rows in the memory cell array 14. Alternatively, all rows of the memory cell array 14 can be grouped into different groups; for example, word-lines WL(m) to WL(m+K−1) are grouped into a first group to share a pair of power-side tracking transistors Mp3 and Mn3, and word-lines WL(m+K) to WL(m+2*K−1) are grouped into a second group to share a different pair of power-side tracking transistors Mp3 and Mn3, etc.

Figure 5:
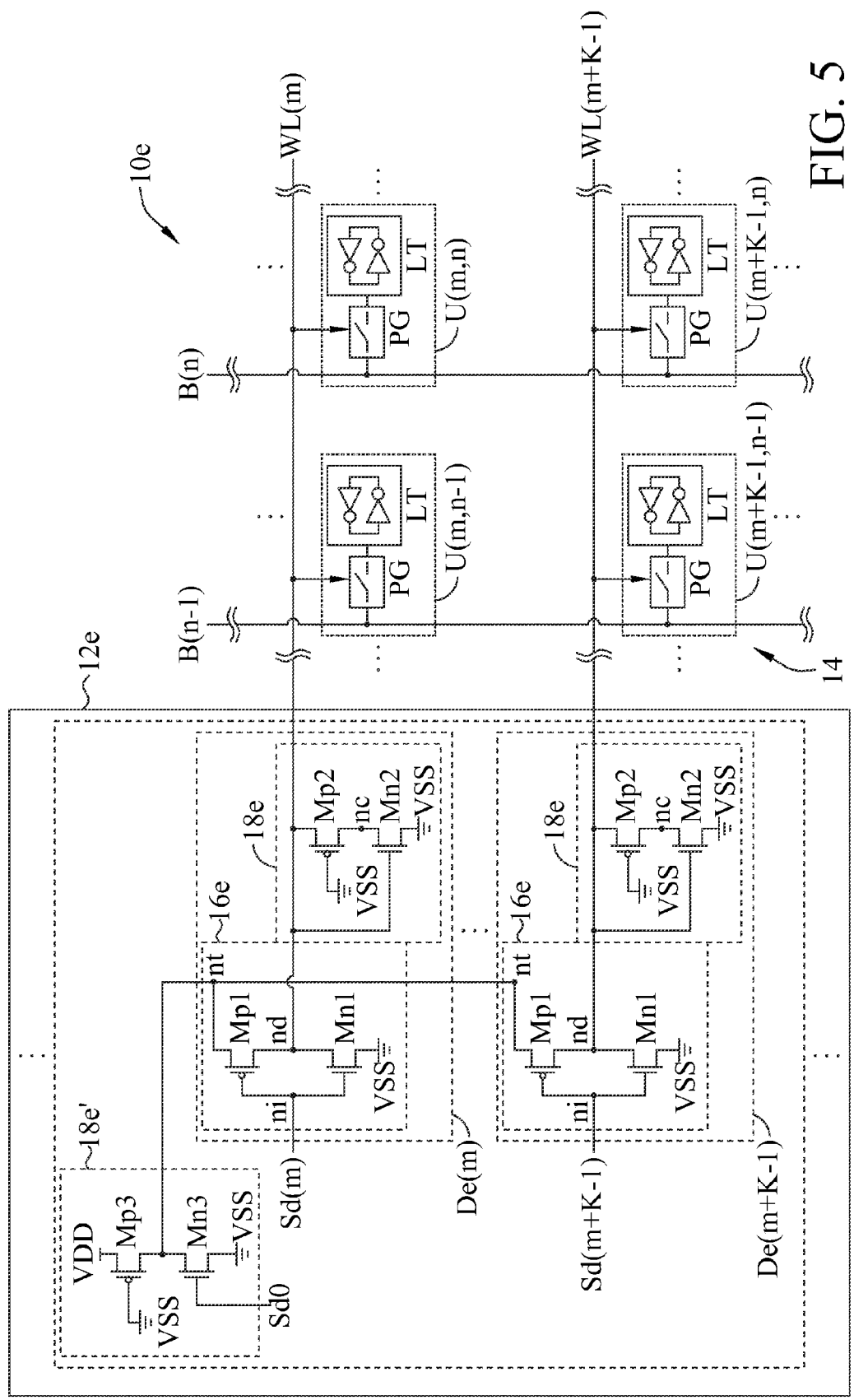
Figure 6:
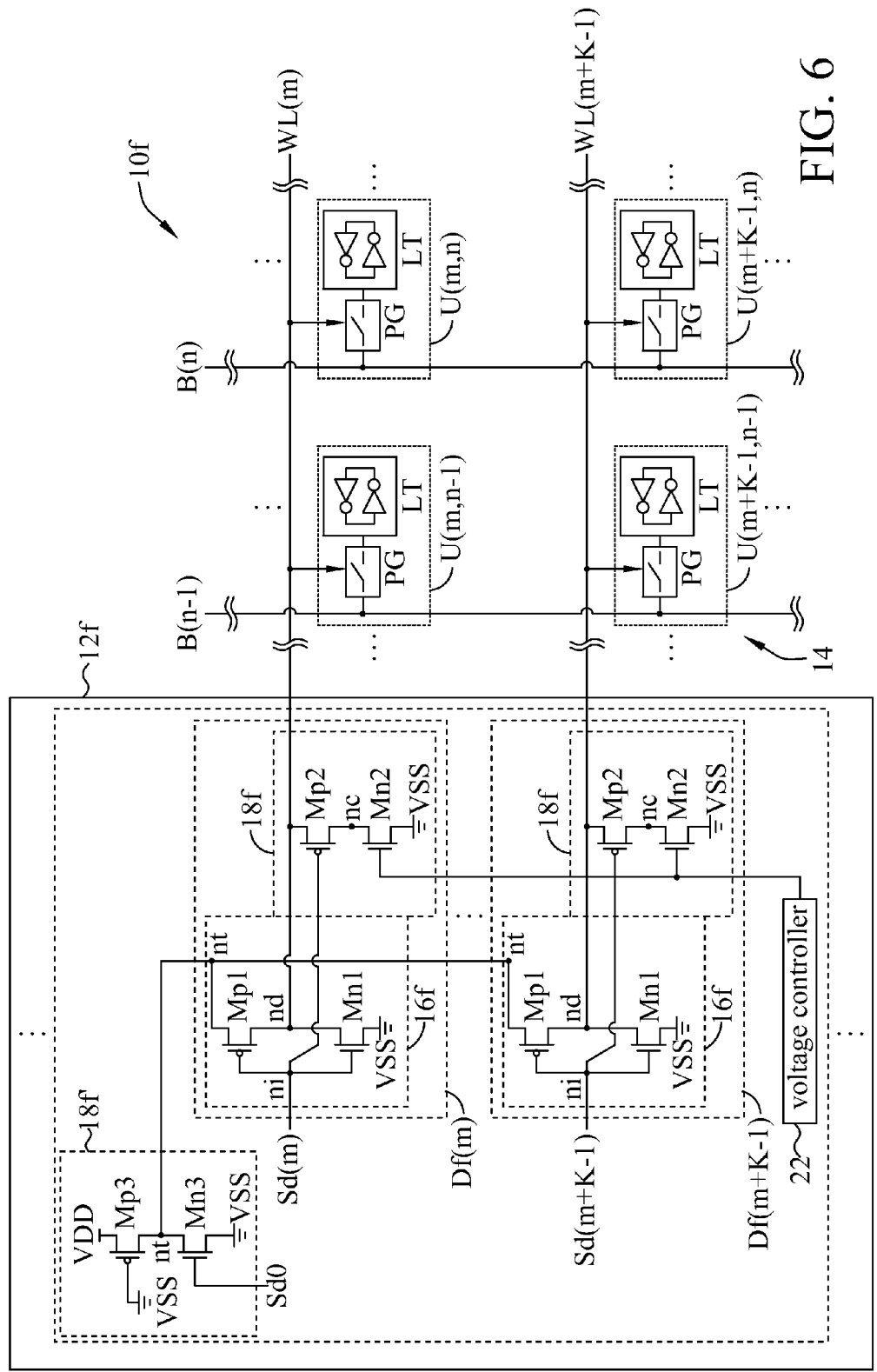
Figure 7:
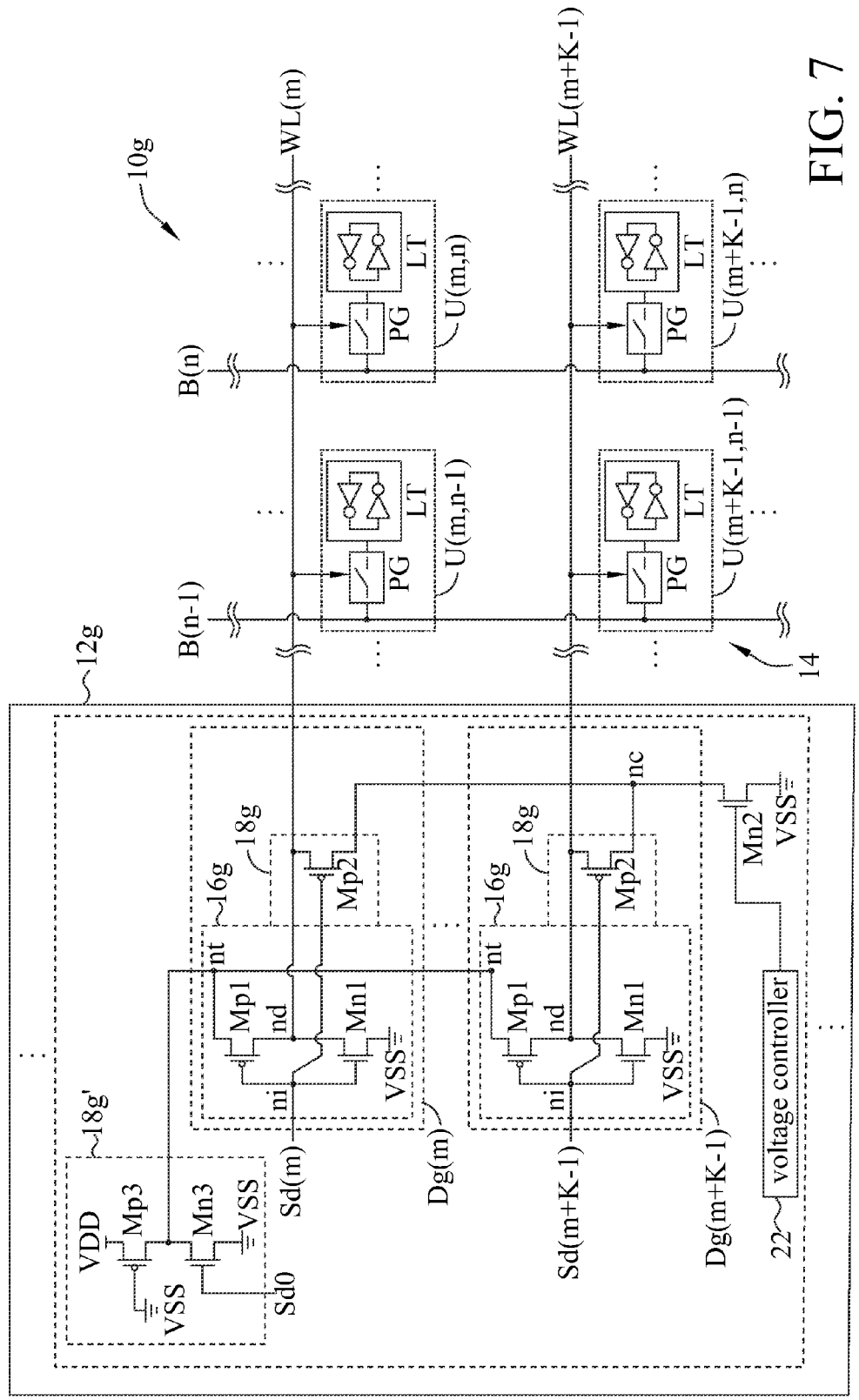

The word-line under-drive schemes of RAMs 10a to 10c can be combined with that of the RAM 10d to form RAMs 10e, 10f and 10g respectively shown in FIGS. 5, 6 and 7. The RAM 10e in FIG. 5 has a word-line driving circuit 12e with word-line driving units such as De(m) to De(m+K−1). Similar to the word-line driving unit Da(m) of FIG. 1, each word-line driving unit of the RAM 10e, generally represented by the word-line driving unit De(m), includes a word-line driver 16e and a voltage adjuster 18e. The word-line driver 16e have an input node, a driving node, and a power node respectively at nodes ni, nd and nt, and includes transistors Mp1 and Mn1 respectively as pull-up and pull-down driving transistors. The voltage adjuster 18e has transistors Mp2 and Mn2 respectively referred to as a driving-side first tracking transistor and a driving-side second tracking transistor. Another voltage adjuster 18e', including transistors Mp3 and Mn3 respectively referred to as a power-side first tracking transistor and a power-side second tracking transistor, supplies operation voltage to the power node nt for the word-line drivers 16e of the word-line driving units De(m) to De(m+K−1).

As the voltage adjuster 18e' supplies an operation voltage lower than the voltage source VDD, the word-line driver 16e and the voltage adjuster 18e in each of word-line driving units De(m) to De(m+K−1) work to provide a word-line enable voltage further lower than the supplied operation voltage, thus a word-line under-drive scheme can be implements with cooperation of voltage adjusters 18e and 18e'. To maintain a variation-tolerant word-line enable voltage, electronic characteristics of the tracking transistors Mp2 and Mp3 track those of the pull-up driving transistors Mp1, and electronic characteristics of the tracking transistors Mn2 and Mn3 track those of the cell pass-gate transistors.

The word-line driving circuit 12f of the RAM 10f in FIG. 6 also has a voltage adjuster 18f' working with word-line drivers 16f and voltage adjusters 18f in grouped word-line driving units Df(m) to Df(m+K−1). In each word-line driving unit, represented by the word-line driving unit Df(m), the transistor Mp2, as a driving-side first tracking transistor, has its control node (gate) coupled to the input node ni of the word-line driver 16f; the transistor Mn2, as a driving-side second tracking transistor, has its control node coupled to a shared voltage controller 22.

As for the RAM 10g of FIG. 7, besides the voltage adjuster 18g' with transistors Mp3 and Mn3 as power-side first and second tracking transistors, each voltage adjuster 18g in each of the grouped word-line driving units Dg(m) to Dg(m+K−1) has a transistor Mp2 as a driving-side first tracking transistor, and the transistors Mp2 of word-line driving units Dg(m) to Dg(m+K−1) couple to a same transistor Mn2 as a shared driving-side second tracking transistor, similar to the circuit shown in FIG. 3.

Figure 8:
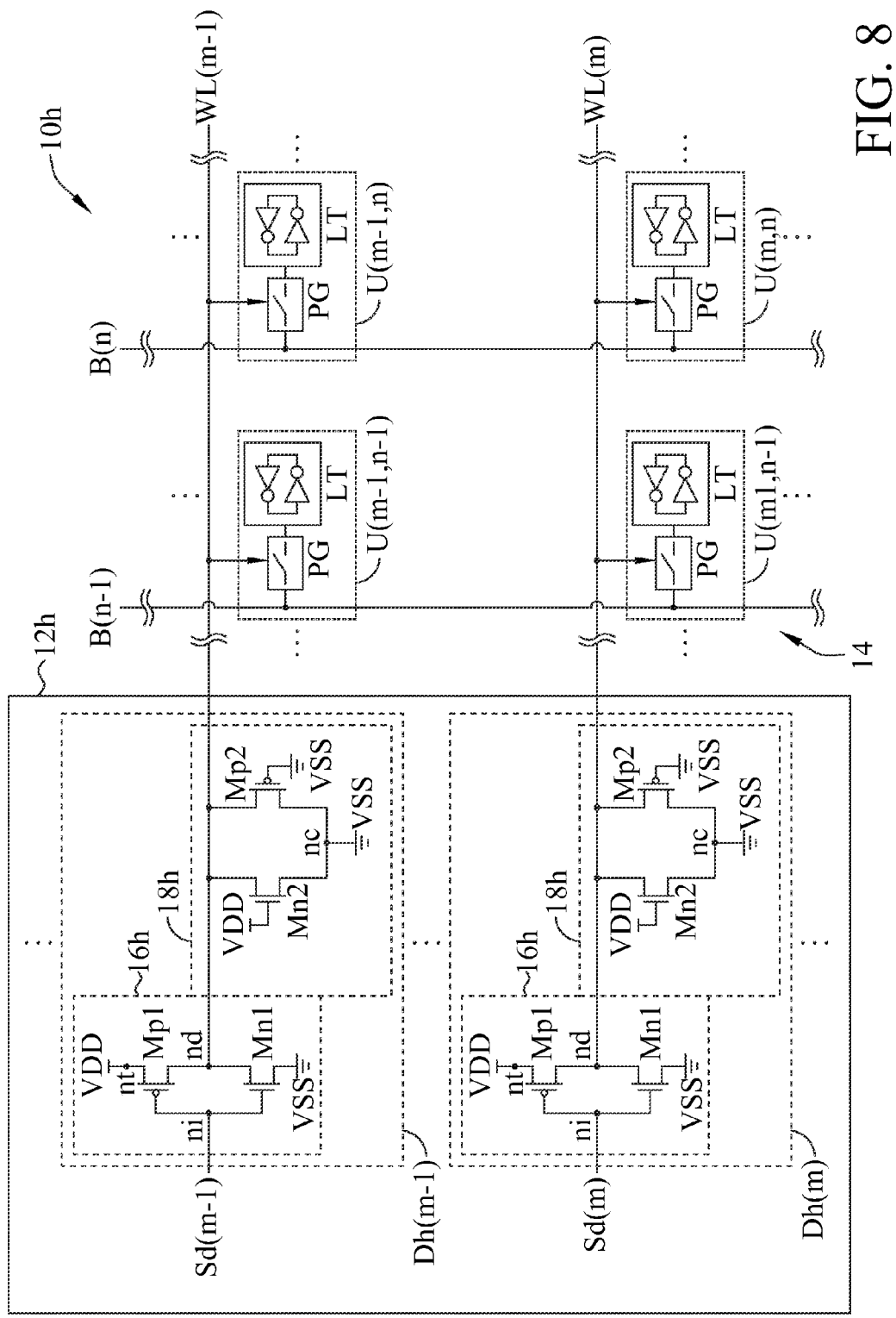

FIG. 8 shows a RAM 10h according to another embodiment of the invention, which has a word-line driving circuit 12h with word-line driving units such as Dh(m−1) and Dh(m). Each word-line driving unit, represented by the word-line driving unit Dh(m), has a word-line driver 16h and a corresponding voltage adjuster 18h. In the word-line driving unit Dh(m), the word-line driver 16h includes two transistors Mp1 and Mn1 as first and second driving transistors, and has nodes ni, nt and nd respectively as an input node receiving a decoding signal Sd(m), a power node receiving operation voltage from the voltage source VDD, and a driving node providing word-line enable voltage for the word-line WL(m) of the memory cell array 14. The voltage adjuster 18h of the word-line driving unit Dh(m) includes transistors Mp2 and Mn2 as first and second tracking transistors; the transistor Mp2 has a control node and two channel terminal nodes respectively coupled to the voltage source VSS, the node nd (i.e. the corresponding word-line), and the voltage source VSS; and the transistor Mn2 has a control node and two channel terminal nodes respectively coupled to the voltage source VDD, the node nd, and the voltage source VSS.

Similar to the serial arrangement of tracking transistors Mp2 and Mn2 adopted in driving circuits 12a to 12c and 12e to 12g, the shunt arrangement of the tracking transistors Mp2 and Mn2 of the word-line driving circuit 12h in FIG. 8 also works to implement a variation-tolerant word-line under-drive scheme with electronic characteristics of the tracking transistors Mp2 and Mn2 respectively tracking those of the transistors Mp1 and cell pass-gate transistors. For example, when the pull-up transistor Mp1 drives the word-line enable voltage, a fast transistor Mp1 with higher current driving capability and less channel resistance (turn-on resistance between channel terminal nodes) tends to raise the voltage of the node nd higher, resulting a word-line enable voltage closer to the voltage source VDD; however, since the driving capability of the transistor Mp2 tracks that of the transistor Mp1, the transistor Mp2 drains more current to lower the voltage of the node nd, therefore the word-line enable voltage at the node nd can be dynamically maintained with reduced dependency on variations. Similarly, if the cell pass-gate transistors coupled to the word-line WL(m) become fast due to variations, they tend to raise the Read disturb voltages at the storing nodes. However, as the transistor Mn2 tracks behavior and performance of the cell pass-gate transistors, the transistor Mn2 drains more current from the node nd to lower the word-line enable voltage of the word-line WL(m), so the channel conductivity of the cell pass-gate transistors, and hence the Read disturb voltage, will be reduced.

Figure 9:
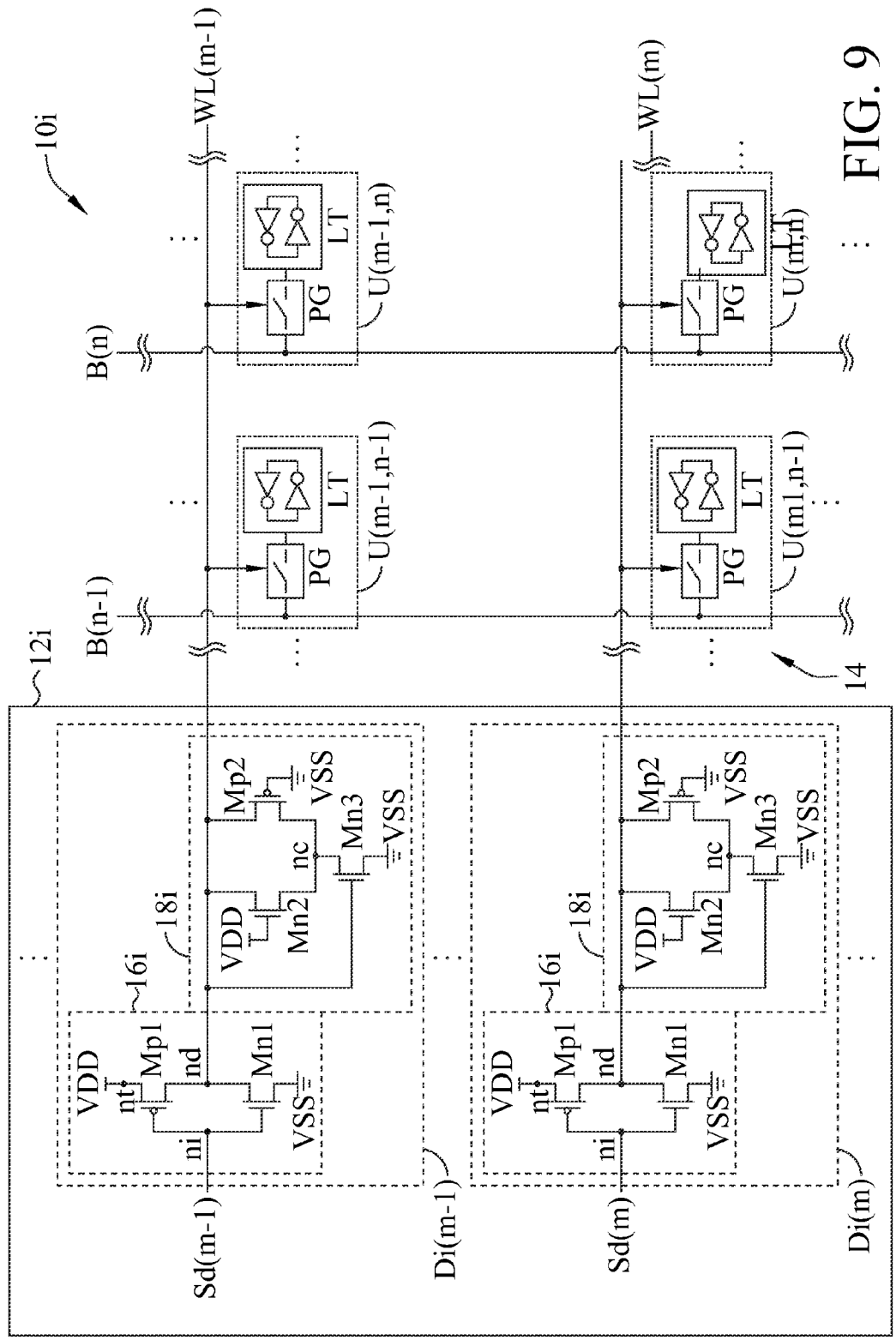
Figure 10:
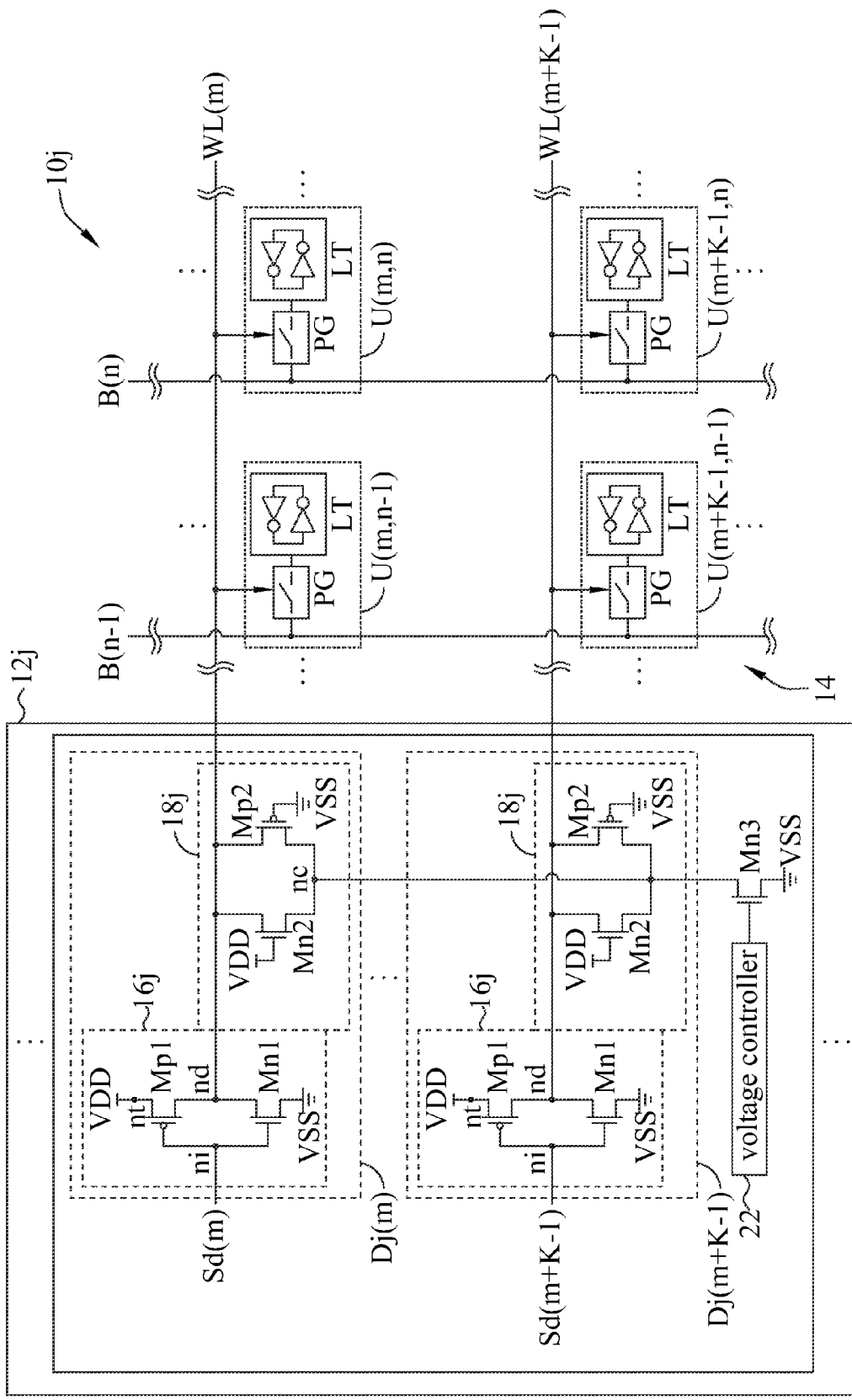

Serial and shunt arrangements of tracking transistors can be combined, as disclosed in RAMs 10i of FIGS. 9 and 10j of FIG. 10. In the word-line driving circuit 12i of the RAM 10i, each word-line driving unit, such as the word-line driving unit Di(m), includes a word-line driver 16i and a voltage adjuster 18i. The voltage adjuster 18i has a transistor Mp2, as a first tracking transistor, and two transistors (e.g., n-channel MOS transistors) Mn2 and Mn3, as a shunt second tracking transistor and a serial second tracking transistor, respectively. In the word-line driving unit Di(m), a control node and two channel terminal nodes of the first tracking transistor Mp2 are respectively coupled to the voltage source VSS, the node nd, and the node nc; a control node and two channel terminal nodes of the shunt second tracking transistor Mn2 are respectively coupled to the voltage source VDD, the node nd, and the node nc; and a control node and two channel terminal nodes of the serial second tracking transistor Mn3 are respectively coupled to the node nd, the node nc, and the voltage source VSS. As electronic characteristics of the transistors Mp2 are designed to track those of the transistor Mp1 and electronic characteristics of the transistors Mn2 and Mn3 are designed to track those of the cell pass-gate transistors, the voltage adjuster 18i and the word-line driver 16i of the word-line driving unit Di(m) provide a variation-tolerant word-line enable voltage.

The serial second tracking transistor Mn3 can be shared by a group of word-line driving units Dj(m) and Dj(m+K−1), as shown in the RAM 10j of FIG. 10. As the voltage adjuster 18j of the word-line driving unit Dj(m) has transistors Mp2 and Mn2 as a first tracking and a shunt second tracking transistors, voltage adjusters 18j of the word-line driving units Dj(m) to Dj(m+K−1) commonly couple to the transistor Mn3 as a shared serial second tracking transistor at node nc, and a variation-tolerant word-line under-drive scheme is thus implemented. The control node of the shared serial second tracking transistor Mn3 can be controlled by a voltage controller 22.

The word-line driving circuits 12a to 12h shown in FIG. 1 to FIG. 10 can be generalized to apply to any kind of memory cell array which needs a variation-tolerant word-line under-drive scheme. For example, multi-port memory cell array, where each cell has multiple ports with each port including an access switch coupled to a corresponding word-line, can have a driving circuit of the invention for word-lines of each port.

Comparing with prior arts which adopt passive resistors and thus suffer from additional performance impacts due to variations of resistors, incomplete tracking of transistor variations (e.g., tracking only variations of cell pass-gate transistors or only variations of word-line pull-up driving transistor), and slow rise-time of word-line enable voltage, the variation-tolerant word-line under-drive scheme of the invention tracks variations of both word-line pull-up driving transistor and cell pass-gate transistors, and thus better mitigates Read disturb, enhances RSNM, and improves rise-time of word-line enable voltages and memory access timing.

The above description is given by way of examples, and not limitation. Given the above disclosure, one skilled in the art could devise variations that are within the scope and spirit of the invention disclosed herein, including configuration ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A Random Access Memory (RAM), comprising:
a plurality of rows, each of the rows comprising a plurality of cells and a corresponding word-line; each cell comprising a latch for storing data, and at least a pass-gate transistor coupled between the latch, the corresponding word-line and a corresponding bit-line;
a plurality of word-line drivers, each of the word-line driver comprising a power node receiving an operation voltage, a driving node coupled to one of the word-lines of the rows, an input node receiving a decoding signal, and a driving transistor comprising a control node and two channel terminal nodes respectively coupled to the input node, the driving node, and the power node;
at least a first tracking transistor, corresponding to one of the word-line driver, comprising two channel terminal nodes with one of the two channel terminal nodes coupled to one of the driving node, and the other channel terminal node coupled to one of the two channel terminal nodes of a second tracking transistors; the first tracking transistor having electronic characteristics tracking those of the pull-up driving transistor of the corresponding word-line driver; and
at least a second tracking transistor comprising two channel terminal nodes with one of the two channel terminal nodes coupled to one of the two channel terminal nodes of the first tracking transistor, the second tracking transistor having electronic characteristics tracking those of the pass-gate transistors of the cells.

2. The RAM of claim 1 comprising a plurality of the first tracking transistors and a plurality of the second tracking transistors, each of the first tracking transistors corresponding to one of the word-line drivers, each of the second tracking transistors corresponding to one of the first tracking transistors, the two channel terminal nodes of each of the first tracking transistors respectively coupled to the driving node of the corresponding word-line driver and one of the two channel terminal nodes of the corresponding second tracking transistor.

3. The RAM of claim 2, wherein the power node of each of the word line drivers is coupled to a first voltage source, each of the first tracking transistors further comprises a control node coupled to a second voltage source, and each of the second tracking transistors further comprises a control node coupled to the driving node of the corresponding word line driver.

4. The RAM of claim 2, wherein the power node of each of the word-line drivers is coupled to a first voltage source, each of the first tracking transistors further comprises a control node coupled to the input node of the corresponding word-line driver, and each of the second tracking transistors further comprises a control node coupled to the driving node of the corresponding word-line driver.

5. The RAM of claim 1 comprising a plurality of the first tracking transistors and one second tracking transistor, each of the first tracking transistors corresponding to one of the word-line driver, the second tracking transistor being a shared second tracking transistor, the two channel terminal nodes of each of the first tracking transistors respectively coupled to the driving node of the corresponding word-line driver and one of the two channel terminal nodes of the shared second tracking transistor.

6. The RAM of claim 1, wherein the two channel terminal nodes of the first tracking transistor are respectively coupled to a first voltage source and the power nodes of the word-line drivers, one of the two channel terminal nodes of the second tracking transistor is coupled to the power nodes of the world-line drivers.

7. The RAM of claim 1 comprising a plurality of the first tracking transistors and a plurality of the second tracking transistors; each of the first tracking transistors further comprising a control node; one of the first tracking transistors being a power-side first tracking transistor, the others of the first tracking transistors being driving-side first tracking transistors; one of the second tracking transistors being a power-side second tracking transistor, the others of the second tracking transistors being driving-side second tracking transistors; the control node and the two channel terminal nodes of the power-side first tracking transistor respectively coupled to a second voltage source, a first voltage source, and the power nodes of the word-line drivers; each of the driving-side second tracking transistors respectively corresponding to one of the driving-side first tracking transistors; the control node and the two channel terminal nodes of each of the driving-side first tracking transistors respectively coupled to the second voltage source, the driving node of one of the word-line drivers, and one of the two channel terminal nodes of the corresponding driving-side second tracking transistor.

8. The RAM of claim 1 comprising a plurality of the first tracking transistors and a plurality of the second tracking transistors; each of the first tracking transistors further comprising a control node; one of the first tracking transistors being a power-side first tracking transistor, the others of the first tracking transistors being driving-side first tracking transistors; one of the second tracking transistors being a power-side second tracking transistor, the others of the second tracking transistors being driving-side second tracking transistors; each of the driving-side first tracking transistors respectively corresponding to one of the driving-side second tracking transistors and one of the word-line drivers; the control node and the two channel terminal nodes of power-side first tracking transistors respectively coupled to a second voltage source, a first voltage source, and the power nodes of the word-line drivers; the control node and the two channel terminal nodes of each of the driving-side first tracking transistors respectively coupled to the input node. The driving node of the corresponding word-line driver, and one of the two channel terminal nodes of the corresponding driving-side second tracking transistor.

9. The RAM of claim 1 comprising a plurality of the first tracking transistors and a plurality of the second tracking transistors; each of the first tracking transistors further comprising a control node; one of the first tracking transistors being a power-side first tracking transistor, the others of the first tracking transistors being driving-side first tracking transistors; one of the second tracking transistors being a power-side second tracking transistor with a different one of the second tracking transistors being a shared driving-side second tracking transistor; each of the driving-side first tracking transistors respectively corresponding to one of the word-line drivers; the control node and the two channel terminal nodes of the power-side first tracking transistors respectively coupled to a second voltage source, a first voltage source, and the power nodes of the word-line drivers; the control node and the two channel terminal nodes of each of the driving-side first tracking transistors respectively coupled to the input node, the driving node of the corresponding word-line driver, and one of the two channel terminal nodes of the shared driving-side second tracking transistor.

10. The RAM of claim 1 comprising a plurality of the first tracking transistors and a plurality of the second tracking transistors; each of the word-line drivers corresponding to one of the first tracking transistors and one of the second tracking transistors with one of the two channel terminal nodes of the corresponding first tracking transistor and one of the two channel terminal nodes of the corresponding second tracking transistor both coupled to the driving node.

11. The RAM of claim 1 comprising a plurality of the first tracking transistors and a plurality of the second tracking transistors, each of the word-line drivers corresponding to one of the first tracking transistors and two of the second tracking transistors respectively being a shunt second tracking transistor and a serial second tracking transistor, with the two channel terminal nodes of the first tracking transistor respectively coupled to the driving node and one of the two channel terminal nodes of the serial second tracking transistor, and the control node of the shunt second transistor coupled to the driving node.

12. The RAM of claim 1 comprising a plurality of the first tracking transistors and a plurality of the second tracking transistors; the word-line drivers corresponding to a shared second tracking transistor of the second tracking transistors; wherein each of the word-line drivers further corresponds to one of the first tracking transistors and one of the second tracking transistors, being a shunt second tracking transistor, besides the shared second tracking transistor, the channel terminal nodes of the corresponding first tracking transistor are respectively coupled to the driving node and one of the two channel terminal nodes of the shared second tracking transistor, and one of the two channel nodes of the corresponding shunt second transistor is coupled to the driving node.

* * * * *